United States Patent
Lin et al.

(10) Patent No.: US 10,312,098 B2
(45) Date of Patent: Jun. 4, 2019

(54) METHOD OF FORMING AN INTERCONNECT STRUCTURE

(71) Applicant: Taiwan Semiconductor Manufacturing Company, Hsinchu (TW)

(72) Inventors: Rueijer Lin, Hsinchu (TW); Ya-Lien Lee, Baoshan Township (TW); Chun-Chieh Lin, Taichung (TW); Hung-Wen Su, Jhubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 16/049,912

(22) Filed: Jul. 31, 2018

(65) Prior Publication Data

US 2018/0337056 A1    Nov. 22, 2018

Related U.S. Application Data

(62) Division of application No. 14/175,685, filed on Feb. 7, 2014, now Pat. No. 10,163,644.

(51) Int. Cl.
*H01L 21/768* (2006.01)
*H01L 21/285* (2006.01)
*H01L 23/532* (2006.01)

(52) U.S. Cl.
CPC .. *H01L 21/28556* (2013.01); *H01L 21/76843* (2013.01); *H01L 21/76847* (2013.01); *H01L 23/53238* (2013.01); *H01L 23/53266* (2013.01); *H01L 2924/0002* (2013.01)

(58) Field of Classification Search
CPC ......... H01L 21/02115; H01L 21/76829; H01L 21/76831; H01L 21/76847; H01L 21/76897
See application file for complete search history.

(56) References Cited

U.S. PATENT DOCUMENTS

| | | |
|---|---|---|
| 6,028,362 A | 2/2000 | Omura |
| 6,040,243 A | 3/2000 | Li et al. |
| 6,218,283 B1 | 4/2001 | Park et al. |
| 6,613,664 B2 | 9/2003 | Barth et al. |
| 6,645,849 B2 | 11/2003 | Kim et al. |
| 8,432,037 B2 | 4/2013 | Maekawa et al. |
| 2005/0064629 A1 | 3/2005 | Yu et al. |
| 2008/0054466 A1 | 3/2008 | Nasu et al. |
| 2008/0315422 A1 | 12/2008 | Boyd et al. |
| 2009/0045514 A1 | 2/2009 | Ishizaka et al. |
| 2010/0048009 A1 | 2/2010 | Hasegawa et al. |
| 2013/0082231 A1 | 4/2013 | Tada et al. |
| 2015/0228605 A1 | 8/2015 | Lin et al. |

FOREIGN PATENT DOCUMENTS

| | | |
|---|---|---|
| TW | 200512869 A | 4/2005 |
| TW | 200707640 A | 2/2007 |

*Primary Examiner* — Hoai V Pham
(74) *Attorney, Agent, or Firm* — Slater Matsil, LLP

(57) ABSTRACT

An interconnect structure and a method of forming an interconnect structure are disclosed. The interconnect structure includes a conductive plug over a substrate; a conductive feature over the conductive plug, wherein the conductive feature has a first sidewall, a second sidewall facing the first sidewall, and a bottom surface; and a carbon-containing barrier layer having a first portion along the first sidewall of the conductive feature, a second portion along the second sidewall of the conductive feature, and a third portion along the bottom surface of the conductive feature.

20 Claims, 6 Drawing Sheets

METHOD OF FORMING AN INTERCONNECT STRUCTURE

PRIORITY CLAIM AND CROSS-REFERENCE

This application is a divisional of U.S. application Ser. No. 14/175,685, filed on Feb. 7, 2014, entitled "Interconnect Structure Including a Conductive Feature and a Barrier Layer on Sidewalls and a Bottom Surface of the Conductive Feature and Method of Forming the Same", which application is hereby incorporated herein by reference.

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) within a semiconductor substrate. BEOL fabrication includes the formation of one or more metal interconnect layers comprised within one or more insulating dielectric layers disposed above the semiconductor substrate. The metal interconnect layers of the BEOL electrically connect individual devices of the FEOL to external pins of an integrated chip.

As the size of a semiconductor device size decreases, there is a trend towards thinner films being used for the diffusion barrier layer. Physical vapor deposition (PVD) process used for depositing a thinner barrier layer encounters difficulties in advanced scale of interconnection. Accordingly, a need has developed in the art for an improved method of forming an interconnect structure for an integrated chip.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 2:
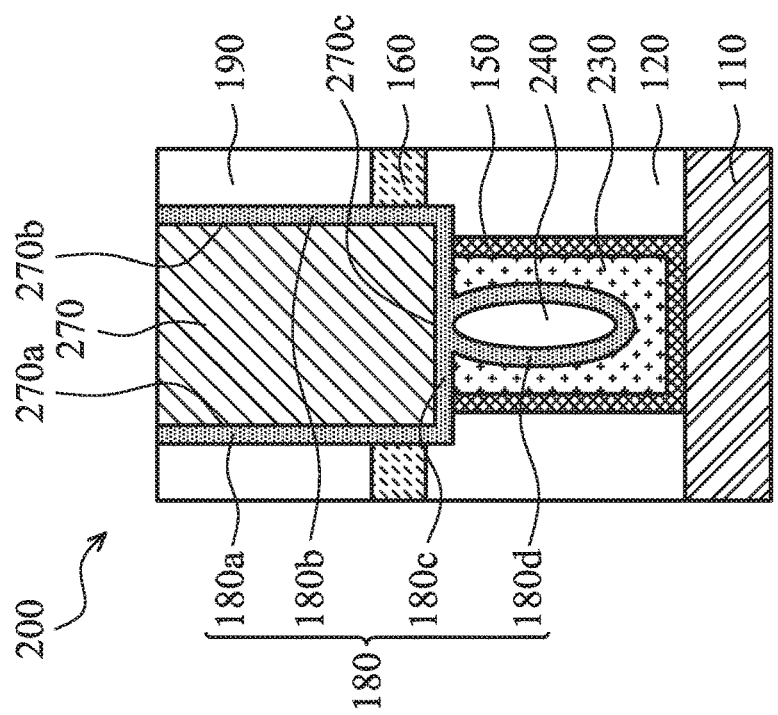
FIG. 2 is a cross-sectional view of an interconnect structure 200 according to various aspects of the present disclosure.

The present disclosure relates generally to semiconductor structures, and more particularly, to methods of forming an interconnect structure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "under", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

Figure 1:
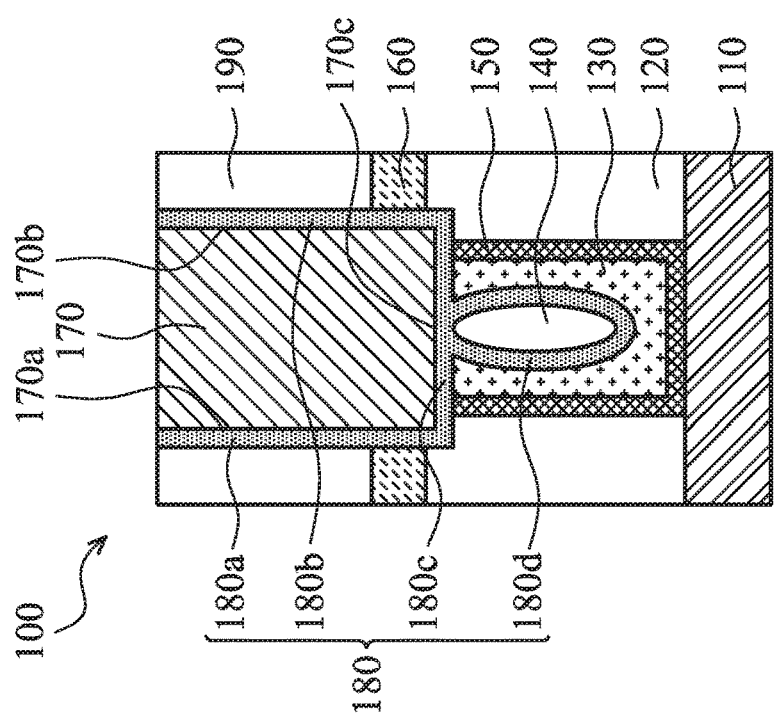
FIG. 1 is a cross-sectional view of an interconnect structure 100 according to various aspects of the present disclosure.

FIG. 1 is a cross-sectional view of an interconnect structure 100 according to various aspects of the present disclosure. As depicted in FIG. 1, the interconnect structure 100 comprises a conductive plug 130 over a substrate 110; a conductive feature 170 over the conductive plug 130, wherein the conductive feature 170 has a first sidewall 170a, a second sidewall 170b facing the first sidewall 170a, and a bottom surface 170c; and a carbon-containing barrier layer 180 having a first portion 180a along the first sidewall 170a of the conductive feature 170, a second portion 180b along the second sidewall 170b of the conductive feature 170, and a third portion 180c along the bottom surface 170c of the conductive feature 170. The interconnect structure 100 may further comprise a lower dielectric layer 120 over the substrate 110, an upper dielectric layer 190 over the lower dielectric layer 120, and an etch stop layer (ESL) 160 between the lower dielectric layer 120 and the upper dielectric layer 190. One skilled in the art will recognize that first sidewall 170a and second sidewall 170b are artifacts of the cross-sectional view of the figures. In an actual device, first sidewall 170a and second sidewall 170b are actually opposing portions of a single sidewall defined by a three-dimensional device.

The substrate 110 may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate 110 may be a semiconductor on insulator (SOI). In some examples, the substrate 110 may include a doped epi layer. In other examples, the substrate 110 may include a multilayer compound semiconductor structure. Alternatively, the substrate 110 may include a non-semiconductor material, such as a glass, fused quartz, or calcium fluoride. In some embodiments, the substrate 110 includes a dielectric layer. In some embodiments, the substrate 110 includes a gate electrode.

In some embodiments, the conductive plug 130 comprises tungsten (W). The conductive plug 130 may be surrounded by a plug barrier layer 150. The plug barrier layer 150 comprises titanium (Ti) or titanium nitride (TiN). In some embodiments, the conductive feature 170 comprises copper (Cu), aluminum (Al), silver (Ag), gold (Au), or alloys thereof. The conductive feature 170 may also comprise one or more cap layers (not shown) having a composition of the formula MxOyNz, where M is a metal, O is oxygen, and N is nitrogen. Generally, the metal is selected from the group consisting of aluminum (Al), manganese (Mn), cobalt (Co), titanium (Ti), tantalum (Ta), tungsten (W), nickel (Ni), tin (Sn), magnesium (Mg), and combinations thereof. The conductive plug 130 or the conductive feature 170 may be formed by a process including, but not limited to, atomic layer deposition (ALD), chemical vapor deposition (CVD), physical vapor deposition (PVD), sputtering, plating, or combinations thereof.

In some embodiments, the carbon-containing barrier layer 180 is formed by ALD, CVD, or combinations thereof. In some embodiments, the carbon-containing barrier layer 180 comprises a metal or a metal nitride. For example, the metal or the metal nitride comprises one or more metal elements selected from tantalum (Ta), titanium (Ti), manganese (Mn), ruthenium (Ru), cobalt (Co), chromium (Cr), aluminum (Al), zirconium (Zr), hafnium (Hf), tin (Sn), molybdenum (Mo), or palladium (Pd). In some embodiments, the carbon-containing barrier layer 180 comprises tantalum nitride (TaN), and an atomic ratio of N divided by Ta is from about 2.3 to about 2.6. When the ratio is lower than 2.3, adhesion of TaN to the upper dielectric layer 190 or the lower dielectric layer 120 will degrade. When the ratio is higher 2.6, adhesion of TaN to the conductive feature 170 will degrade. In some embodiments, the precursors used in ALD or CVD to form the carbon-containing barrier layer 180 contain carbon impurities. For example, the precursors may include (tert-amylimido)tris(dimethylamido)tantalum ("TAIMATA"), (tert-butylimido)tris(ethylmethylamido)tantalum ("TBTEMT"), tris(diethylamino)(tert-butylimido)tantalum ("TBTDMT"), pentakis(dimethylamino)tantalum ("PDMAT"), tetrakis(dimethylamino)titanium ("TDMAT"), bis(ethylcyclopentadienyl)Ruthenium ("Ru(EtCp)$_2$"), cyclopentadienyl-propylcyclopentadienylruthenium ("RuCp(i-PrCp)"), bis(methylcyclopentadienyl)ruthenium ("Ru(MeCp)$_2$"), tris(acetylacetonate)ruthenium ("Ru(acac)$_3$"), triruthenium dodecacarbonyl ("Ru$_3$(CO)$_{12}$"), cobalt dicarbonyl cyclopentadiene ("CpCo(CO)$_2$"), or dicobalt hexacarbonyl tert-butylacetylene ("CCTBA"). The carbon-containing barrier layer 180 has a carbon concentration of at least about 0.1 atomic percent (at %). The carbon impurities can help adhesion of the carbon-containing barrier layer 180 to the upper dielectric layer 190 or the lower dielectric layer 120. In addition, the carbon impurities can help prevent a conductive material in the conductive feature 170 from diffusing into the upper dielectric layer 190 or the lower dielectric layer 120. In some embodiments, the carbon-containing barrier layer 180 has a carbon concentration from about 0.1 at % to about 5 at %. For example, the carbon concentration is from 0.2 at % to 1 at %. If the carbon concentration is higher than 5 at %, it may cause the "effective" k value of the upper dielectric layer 190 or the lower dielectric layer 120 become higher than expected.

As depicted above, in some embodiments, the carbon-containing barrier layer 180 is formed by ALD, CVD, or combinations thereof. The deposition uniformity is well controlled. In some embodiments, a ratio of a thickness of the first portion 180a or the second portion 180b divided by a thickness of the third portion 180c is from about 0.9 to about 1.1. As mentioned above, the carbon-containing barrier layer 180 is formed by ALD, CVD, or combinations thereof. Because the deposition uniformity is good for ALD or CVD, the ratio of the sidewall thickness divided by the bottom thickness of the carbon-containing barrier layer 180 can be maintained from 90% to 110%. For example, the ratio is 0.95. In some embodiments, the thickness of the first portion 180a or the second portion 180b is in a range from about 4.5 angstroms (Å) to about 55 angstroms (Å). In some embodiments, the thickness of the third portion 180c is in a range from about 5 angstroms (Å) to about 50 angstroms (Å). In some embodiments, the conductive plug 130 comprises a void 140, and the carbon-containing barrier layer 180 further comprises a fourth portion 180d surrounding and sealing the void 140.

As depicted above, in some embodiments, the interconnect structure 100 further comprises the lower dielectric layer 120 over the substrate 110, the upper dielectric layer 190 over the lower dielectric layer 120, and the ESL 160 between the lower dielectric layer 120 and the upper dielectric layer 190. A dielectric material of the lower dielectric layer 120 or the upper dielectric layer 190 comprises an oxide, SiO$_2$, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8. The lower dielectric layer 120 or the upper dielectric layer 190 may be formed by ALD, CVD, PVD, or combinations thereof.

The ESL 160 is extended through by the conductive structure 170. The material for the ESL 160 includes SiO, SiC, SiN, SiOC, SiON, SiCN, TiN, AlN, AlON, TEOS, hard black diamond (HBD), or the like. Alternatively, the ESL 160 may be formed by depositing and annealing a metal oxide material, which includes Hf, HfO$_2$, or Al. The ESL 160 may be formed using a suitable process such as ALD, CVD, PVD, molecular beam epitaxy (MBE), spin-on, or combinations thereof. In some embodiments, the ESL 160 has a thickness in a range from about 10 Å to about 300 Å.

The interconnect structures of the present disclosure are not limited to the above-mentioned embodiments, and may have other different embodiments. To simplify the description and for the convenience of comparison between each of the embodiments of the present disclosure, corresponding components in each of the following embodiments are marked with the same numerals. For making it easier to compare the difference between the embodiments, the following description will detail the dissimilarities among different embodiments and the identical features will not be redundantly described.

FIG. 2 is a cross-sectional view of an interconnect structure 200 according to various aspects of the present disclosure. As depicted in FIG. 2, the interconnect structure 200 comprises a tungsten (W) plug 230 having a seam 240 over a substrate 110; a copper (Cu) line 270 over the W plug 230, wherein the Cu line 270 has a first sidewall 270a, a second sidewall 270b facing the first sidewall 270a, and a bottom surface 270c; and a carbon-containing barrier layer 180 having a first portion 180a along the first sidewall 270a of the Cu line 270, a second portion 180b along the second sidewall 270b of the Cu line 270, a third portion 180c along the bottom surface 270c of the Cu line 270, and a fourth portion 180d surrounding and sealing the seam 240, wherein the carbon-containing barrier layer 180 has a carbon concentration of at least about 0.1 atomic percent (at %). The interconnect structure 200 may further comprise a lower dielectric layer 120 over the substrate 110, an upper dielectric layer 190 over the lower dielectric layer 120, and an etch stop layer (ESL) 160 between the lower dielectric layer 120 and the upper dielectric layer 190.

The Cu line 270 may also comprise one or more cap layers (not shown) having a composition of the formula MxOyNz, where M is a metal, O is oxygen, and N is nitrogen. Generally, the metal is selected from the group consisting of Al, Mn, Co, Ti, Ta, W, Ni, Sn, Mg, and combinations thereof. The W plug 230 or the Cu line 270 may be formed by a process including, but not limited to, ALD, CVD, PVD, sputtering, plating, or combinations thereof. In some embodiments, the carbon-containing barrier layer 180 further comprises a fourth portion 180d surrounding and sealing the seam 240.

Figure 3:
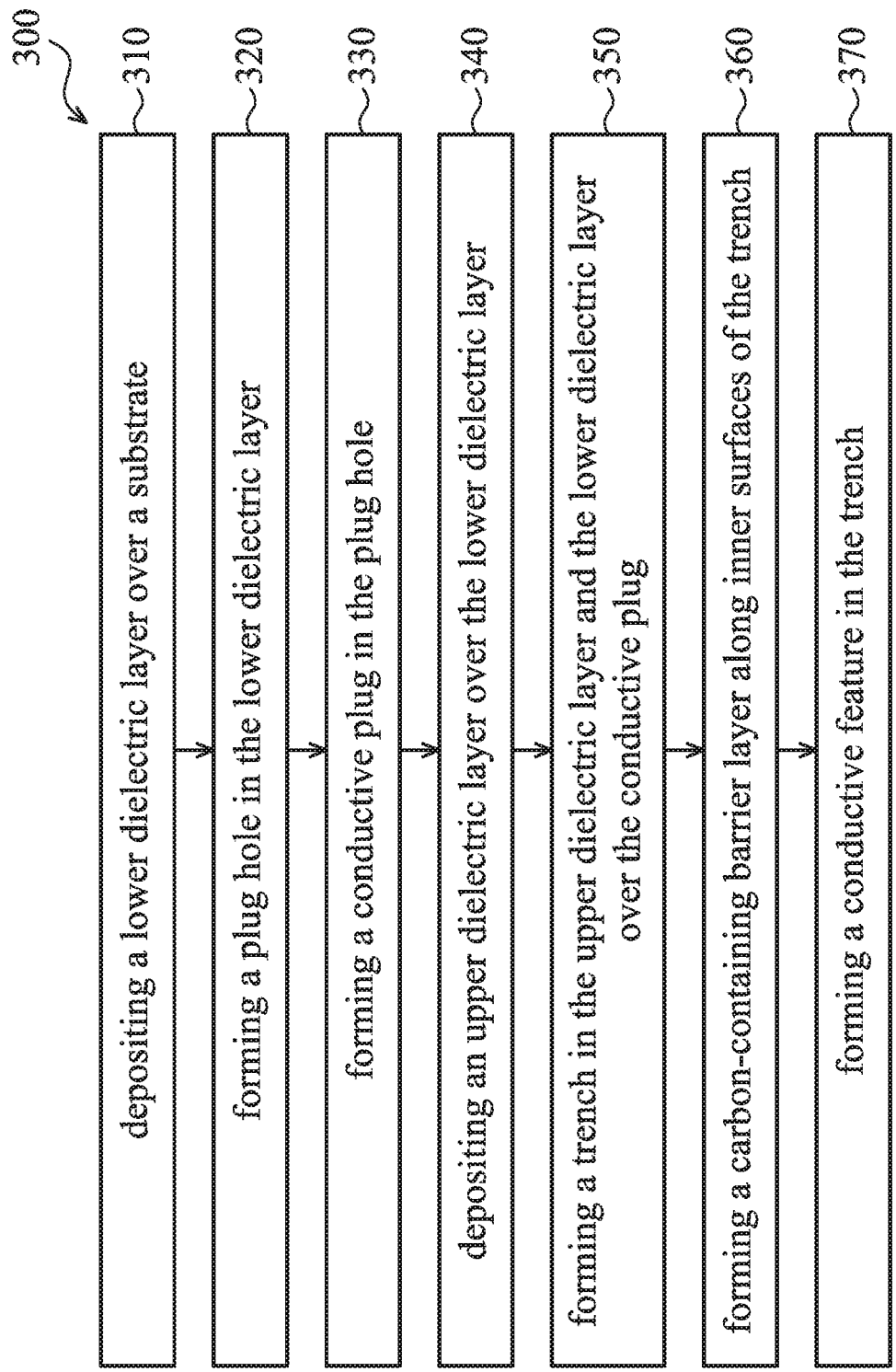
FIG. 3 is a flowchart of a method 300 of forming the interconnect structure 100 according to various aspects of the present disclosure.

FIG. 3 is a flowchart of a method 300 of forming the interconnect structure 100 according to various aspects of the present disclosure. It is understood that additional steps can be provided before, during, and after the method 300, and some of the steps described can be replaced or eliminated for other embodiments of the method 300. The method 300 begins at step 310 in which a lower dielectric layer 120 is deposited over a substrate 110. The method 300 continues with step 320 in which a plug hole 122 is formed in the lower dielectric layer 120. The method 300 continues with step 330 in which a conductive plug 130 is formed in the plug hole 122. The method 300 continues with step 340 in which an upper dielectric layer 190 is deposited over the lower dielectric layer 120. The method 300 continues with step 350 in which a trench 192 is formed in the upper dielectric layer 190 and the lower dielectric layer 120 over the conductive plug 130. The method 300 continues with step 360 in which a carbon-containing barrier layer 180 is formed along inner surfaces of the trench 192. The method 300 continues with step 370 in which a conductive feature 170 is formed in the trench 192. An etch stop layer (ESL) 160 may be further formed between the lower dielectric layer 120 and the upper dielectric layer 190. The discussion that follows illustrates embodiments of the interconnect structure 100 that can be fabricated according to the method 300 of FIG. 3.

Figure 5:
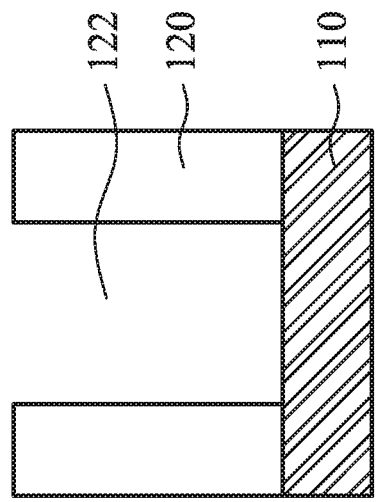
FIGS. 4-10 are cross-sectional views of the interconnect structure 100 at various stages of fabrication according to various aspects of the present disclosure.
Figure 4:
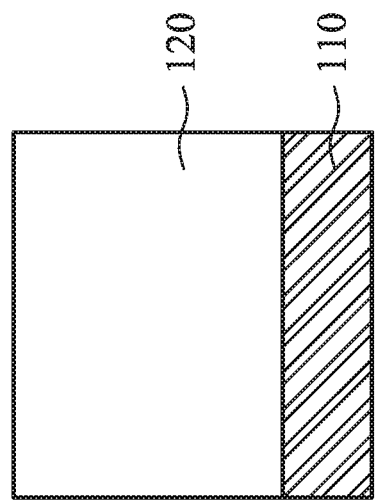

FIGS. 4-10 are cross-sectional views of the interconnect structure 100 at various stages of fabrication according to various aspects of the present disclosure. As depicted in FIG. 4 and step 310 in FIG. 3, the method 300 begins at step 310 by depositing a lower dielectric layer 120 over a substrate 110. As depicted in FIG. 5 and step 320 in FIG. 3, the method 300 continues with step 320 by forming a plug hole 122 in the lower dielectric layer 120. Step 320 may comprise using an etch process. For example, step 320 is performed by an anisotropic etch process (e.g., dry etching).

Figure 7:
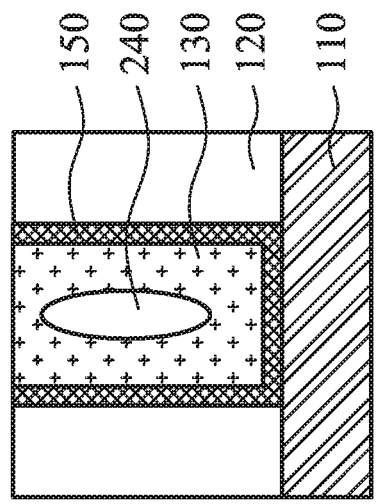
Figure 6:
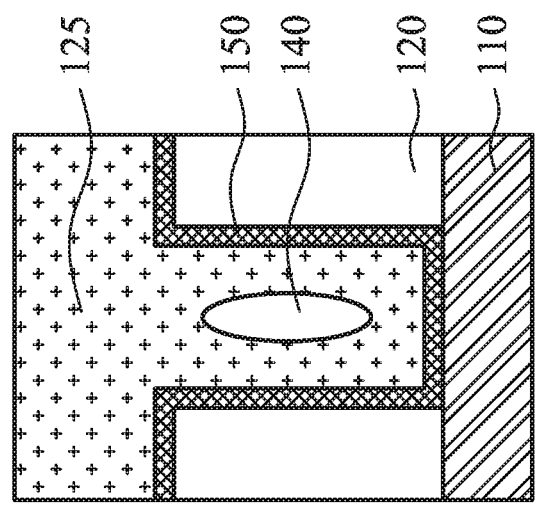

As depicted in FIG. 6, FIG. 7, and step 330 in FIG. 3, the method 300 continues with step 330 by forming a conductive plug 130 in the plug hole 122. In some embodiments, a void 140 is formed in the conductive plug 130. Step 330 comprises: forming a conductive film 125 in the plug hole 122; and performing chemical-mechanical planarization (CMP) on at least one of the lower dielectric layer 120 or the conductive film 125. The conductive film 125 may be formed by a process including, but not limited to, ALD, CVD, PVD, sputtering, plating, or combinations thereof. In some embodiments, the conductive film 125 comprises W. In some embodiments, step 330 further comprises forming a plug barrier layer 150 in the plug hole 122 before the forming the conductive film 125. The plug barrier layer 150 comprises Ti or TiN.

Figure 8:
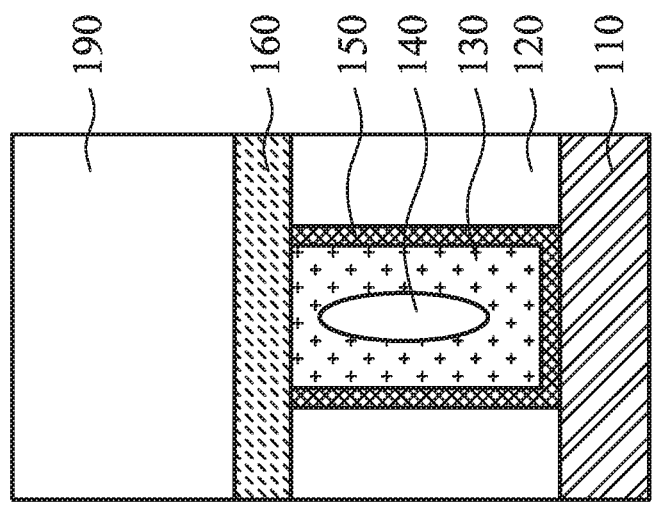

As depicted in FIG. 8 and step 340 in FIG. 3, the method 300 continues with step 340 by depositing an upper dielectric layer 190 over the lower dielectric layer 120. The lower dielectric layer 120 or the upper dielectric layer 190 may be formed by ALD, CVD, PVD, or combinations thereof. A dielectric material of the lower dielectric layer 120 or the upper dielectric layer 190 comprises an oxide, $SiO_2$, SiOCH, BPSG, TEOS, SOG, USG, FSG, HDP oxide, PETEOS, fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. For example, k is between about 1.5 and about 2.8.

Figure 9:
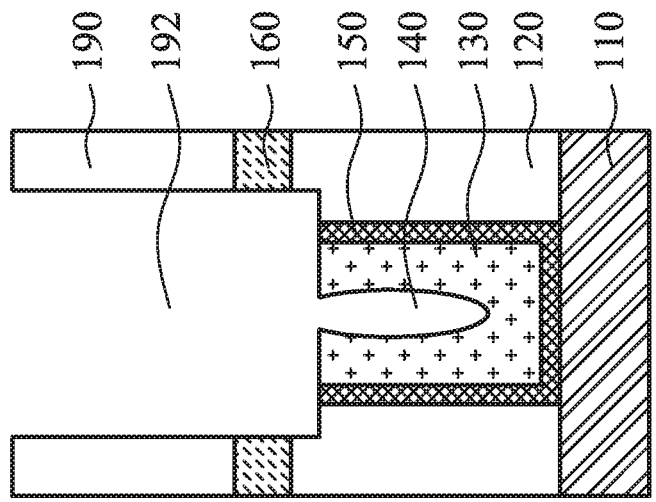

As depicted in FIG. 9 and step 350 in FIG. 3, the method 300 continues with step 350 by forming a trench 192 in the upper dielectric layer 190 and the lower dielectric layer 120 over the conductive plug 130. Step 350 may comprise using an etch process. For example, step 350 is performed by an anisotropic etch process (e.g., dry etching). In some embodiments, step 350 further comprises exposing an upper portion of the void 140.

The process steps up to this point have provided the interconnect structure 100 having the trench 192 over the conductive plug 130. Conventionally, a barrier layer would be formed along inner surfaces of the trench 192 using PVD or sputtering. However, when a conductive material such as Cu is formed over the barrier layer later on, the conductive material may still diffuse into the conductive plug 130 especially into the void 140, thereby degrading the device performance.

Accordingly, the processing discussed below with reference to FIG. 10 may form a novel barrier layer along inner surfaces of the trench 192 to impede diffusion of the conductive material into the conductive plug 130. Problems associated with low yield and bad reliability may be reduced and/or avoided. Thus, Applicant's method may achieve the desired device performance characteristics.

Figure 10:
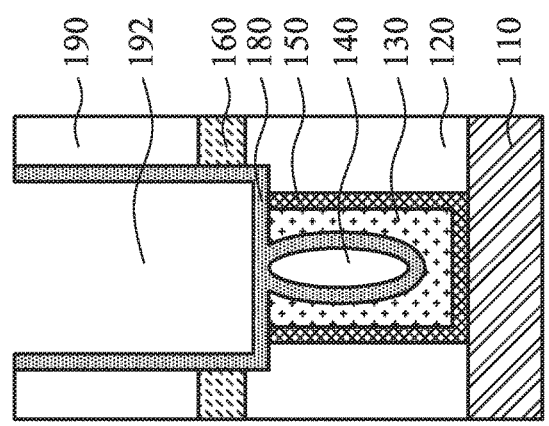

As depicted in FIG. 10 and step 360 in FIG. 3, the method 300 continues with step 360 by forming a carbon-containing barrier layer 180 along inner surfaces of the trench 192. In some embodiments, step 360 further comprises forming the carbon-containing barrier layer 180 along inner surfaces of the void 140 and sealing the upper portion of the void 140. In some embodiments, step 360 is performed by ALD, CVD, or combinations thereof. In some embodiments, the carbon-containing barrier layer 180 comprises a metal or a metal nitride. For example, the metal or the metal nitride comprises one or more metal elements selected from Ta, Ti, Mn, Ru, Co, Cr, Al, Zr, Hf, Sn, Mo, or Pd. In some embodiments, the carbon-containing barrier layer 180 comprises TaN, and an atomic ratio of N divided by Ta is from about 2.3 to about 2.6. In some embodiments, the precursors used in ALD or CVD to form the carbon-containing barrier layer 180 contain carbon impurities. For example, the precursors may include (tert-amylimido)tris(dimethylamido)tantalum ("TAIMATA"), (tert-butylimido)tris(ethylmethylamido)tantalum ("TBTEMT"), tris(diethylamino)(tert-butylimido)tantalum ("TBTDMT"), pentakis(dimethylamino)tantalum ("PDMAT"), tetrakis(dimethylamino)titanium ("TDMAT"), bis(ethylcyclopentadienyl)Ruthenium ("Ru(EtCp)$_2$"), cyclopentadienyl-propylcyclopentadienylruthenium ("RuCp(i-PrCp)"), bis(methylcyclopentadienyl)ruthenium ("Ru(MeCp)$_2$"), tris(acetylacetonate)ruthenium ("Ru(acac)$_3$"), triruthenium dodecacarbonyl ("Ru$_3$(CO)$_{12}$"), cobalt dicarbonyl cyclopentadiene ("CpCo(CO)$_2$"), or dicobalt hexacarbonyl tert-butylacetylene ("CCTBA"). The carbon-containing barrier layer 180 has a carbon concentration of at least about 0.1 atomic percent (at %). In some embodiments, the carbon-containing barrier layer 180 has a carbon concentration from about 0.1 at % to about 5 at %. For example, the carbon concentration is from 0.2 at % to 1 at %. Carbon impurities would not be found in one barrier layer formed by a conventional approach (such as PVD or sputtering) other than ALD or CVD.

As depicted in FIG. 1 and step 370 in FIG. 3, the method 300 continues with step 370 by forming a conductive feature 170 in the trench 192. The conductive feature 170 may be formed by a process including, but not limited to, ALD, CVD, PVD, sputtering, plating, or combinations thereof. The conductive feature 170 comprises Cu, Al, Ag, Au, or alloys thereof. The conductive feature 170 may also comprise one or more cap layers (not shown) having a composition of the formula MxOyNz, where M is a metal, O is oxygen, and N is nitrogen. Generally, the metal is selected from the group consisting of Al, Mn, Co, Ti, Ta, W, Ni, Sn, Mg, and combinations thereof.

As depicted in FIG. 1, in some embodiments, the method 300 further comprises forming an etch stop layer (ESL) 160 between the lower dielectric layer 120 and the upper dielectric layer 190. The ESL 160 may be formed using a suitable process such as ALD, CVD, PVD, MBE, spin-on, or combinations thereof. The material for the ESL 160 includes SiO, SiC, SiN, SiOC, SiON, SiCN, TiN, AlN, AlON, TEOS, hard black diamond (HBD), or the like. Alternatively, the ESL 160 may be formed by depositing and annealing a metal oxide material, which includes Hf, HfO$_2$, or Al. In some embodiments, the ESL 160 has a thickness in a range from about 10 Å to about 300 Å. The ESL 160 is extended through by the conductive structure 170.

The methods of the present disclosure are not limited to be used by a planar device on the substrate and can be applied to a non-planar device as well, such as a fin-like field effect transistor (FinFET) or a nanowire device. Based on the discussions above, it can be seen that by using the methods of the present disclosure, diffusion of the conductive material (of the conductive feature) into the conductive plug is impeded by forming a carbon-containing barrier layer along inner surfaces of the trench. The thickness of the carbon-containing barrier layer is substantially conformal along the sidewalls and the bottom surface of the conductive feature. Especially when a void is formed in the conductive plug, the carbon-containing barrier layer is configured to surround and seal the void to prevent the conductive material (of the conductive feature) from filling the void. As a result, the yield and reliability of the device can be well controlled by using the methods of the present disclosure.

One of the broader forms of the present disclosure involves an interconnect structure. The interconnect structure comprises a conductive plug over a substrate; a conductive feature over the conductive plug, wherein the conductive feature has a first sidewall, a second sidewall facing the first sidewall, and a bottom surface; and a carbon-containing barrier layer having a first portion along the first sidewall of the conductive feature, a second portion along the second sidewall of the conductive feature, and a third portion along the bottom surface of the conductive feature.

Another of the broader forms of the present disclosure involves an interconnect structure. The interconnect structure comprises a tungsten (W) plug having a seam over a substrate; a copper (Cu) line over the W plug, wherein the Cu line has a first sidewall, a second sidewall facing the first sidewall, and a bottom surface; and a carbon-containing barrier layer having a first portion along the first sidewall of the Cu line, a second portion along the second sidewall of the Cu line, a third portion along the bottom surface of the Cu line, and a fourth portion surrounding and sealing the seam, wherein the carbon-containing barrier layer has a carbon concentration of at least about 0.1 atomic percent (at %).

Still another of the broader forms of the present disclosure involves a method of forming an interconnect structure. The method comprises depositing a lower dielectric layer over a substrate; forming a plug hole in the lower dielectric layer; forming a conductive plug in the plug hole; depositing an upper dielectric layer over the lower dielectric layer; forming a trench in the upper dielectric layer and the lower dielectric layer over the conductive plug; forming a carbon-containing barrier layer along inner surfaces of the trench; and forming a conductive feature in the trench.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an interconnect structure, the method comprising:
    depositing a lower dielectric layer over a substrate;
    forming a plug hole in the lower dielectric layer;
    forming a conductive plug in the plug hole;
    depositing an upper dielectric layer over the lower dielectric layer;
    forming a trench in the upper dielectric layer and the lower dielectric layer over the conductive plug;

forming a carbon-containing barrier layer along inner surfaces of the trench, wherein the carbon-containing barrier layer extends below an uppermost surface of the conductive plug and seals a void in the conductive plug, wherein the carbon-containing barrier layer completely separates the void from the conductive plug; and forming a conductive feature in the trench.

2. The method of claim 1, wherein the forming the carbon-containing barrier layer is performed by atomic layer deposition (ALD), chemical vapor deposition (CVD), or combinations thereof.

3. The method of claim 1, further comprising forming an etch stop layer over the lower dielectric layer, wherein the upper dielectric layer is formed over the etch stop layer.

4. The method of claim 1, wherein forming the trench comprises etching the lower dielectric layer.

5. The method of claim 1, wherein a ratio of a thickness of the carbon-containing barrier layer along a sidewall to a thickness of the carbon-containing barrier layer along a bottom is from 0.9 to 1.1.

6. The method of claim 1, wherein a thickness of the carbon-containing barrier layer is from 4.5 Angstroms to 55 Angstroms.

7. A method of forming an interconnect structure, the method comprising:

depositing a lower dielectric layer over a substrate;

forming a first recess in the lower dielectric layer;

forming a first conductive layer in the first recess, the first conductive layer having a void;

depositing an upper dielectric layer over the lower dielectric layer and the first conductive layer;

forming a second recess in the upper dielectric layer, wherein the second recess exposes the first conductive layer;

after forming the second recess, removing a portion of the first conductive layer to expose the void;

forming a carbon-containing layer along sidewalls of the void; and forming a second conductive layer over the carbon-containing layer.

8. The method of claim 7, wherein the carbon-containing layer seals the void.

9. The method of claim 7, wherein the second conductive layer does not extend into the void.

10. The method of claim 7, wherein a width of the first recess is less than a width of the second recess.

11. The method of claim 7, wherein removing a portion of the first conductive layer removes a portion of the lower dielectric layer.

12. The method of claim 7, wherein the carbon-containing layer completely separates the first conductive layer and the second conductive layer.

13. The method of claim 7, wherein the void has an elliptical shape.

14. A method of forming an interconnect structure, the method comprising:

forming a first dielectric layer;

forming a first recess in the first dielectric layer;

forming a first conductive layer in the first recess, an upper surface of the first conductive layer being level with an uppermost surface of the first dielectric layer, the first conductive layer having a void;

forming a second dielectric layer over the first dielectric layer;

after forming the second dielectric layer, forming a second recess through the second dielectric layer to the first conductive layer, wherein forming the second recess removes at least a portion of the first conductive layer to expose the void;

forming a carbon-containing layer along sidewalls of the second recess and sidewalls of the void; and forming a second conductive layer over the carbon-containing layer, an upper surface of the second conductive layer and the second dielectric layer being level.

15. The method of claim 14, wherein the carbon-containing layer comprises tantalum nitride (TaN), and wherein an atomic ratio of N divided by Ta is from about 2.3 to about 2.6.

16. The method of claim 14, wherein the carbon-containing layer has a carbon concentration from about 0.1 atomic percent (at %) to about 5 atomic percent (at %).

17. The method of claim 14, wherein the carbon-containing layer comprises a metal or a metal nitride.

18. The method of claim 14, wherein the carbon-containing layer has a first portion along sidewall of the second recess, a second portion along a bottom of the second recess, and a third portion lining the void, wherein a ratio of a thickness of the first portion to a thickness of the second portion is from about 0.9 to about 1.1.

19. The method of claim 18, wherein the thickness of the first portion is in a range from about 4.5 angstroms to about 55 angstroms.

20. The method of claim 18, wherein the thickness of the second portion is in a range from about 5 angstroms to about 50 angstroms.

* * * * *